(12) United States Patent
Song

(10) Patent No.: US 9,805,800 B1
(45) Date of Patent: Oct. 31, 2017

(54) ELECTRICALLY PROGRAMMABLE READ ONLY MEMORY DEVICES HAVING UNIFORM PROGRAM CHARACTERISTIC AND METHODS OF PROGRAMMING THE SAME

(71) Applicant: SK hynix Inc., Icheon-si, Gyeonggi-do (KR)

(72) Inventor: Hyun Min Song, Sejong (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/410,974

(22) Filed: Jan. 20, 2017

(30) Foreign Application Priority Data

May 17, 2016 (KR) .................. 10-2016-0060450

(51) Int. Cl.
| | | |
|---|---|---|
| *G11C 16/10* | (2006.01) | |
| *G11C 16/04* | (2006.01) | |
| *G11C 17/00* | (2006.01) | |
| *G11C 16/00* | (2006.01) | |

(52) U.S. Cl.
CPC .......... *G11C 16/10* (2013.01); *G11C 16/0483* (2013.01); *G11C 16/00* (2013.01); *G11C 17/00* (2013.01)

(58) Field of Classification Search
CPC ................ G11C 17/00; G11C 16/00
USPC ............................................. 365/94
See application file for complete search history.

(56) References Cited

U.S. PATENT DOCUMENTS 7,042,772 B2 * 5/2006 Wang .................. G11C 11/5692
365/185.23
2008/0247228 A1 10/2008 Nguyen et al.

FOREIGN PATENT DOCUMENTS

KR       1019990060474 A      7/1999

* cited by examiner

*Primary Examiner* — Jason Lappas
(74) *Attorney, Agent, or Firm* — William Park & Associates Ltd.

(57) ABSTRACT

An EPROM device includes bit lines branching from a supply voltage line, a first group of enablement signal lines intersecting the bit lines, unit cells respectively located at cross points of the bit lines and the first group of enablement signal lines, pass transistors, load transistors, comparators, and enablement signal generators. One of the pass transistors and one of the load transistors are coupled in series between the supply voltage line and each of the bit lines. Each of the comparators receives voltages of both ends of any one of the load transistors to generate an output signal. Each of the enablement signal generators receives one of the output signals of the comparators and one of a second group of enablement signals and outputs one of a third group of enablement signals to turn off one of the pass transistors responsive to a program current reaching a reference value.

17 Claims, 9 Drawing Sheets

ELECTRICALLY PROGRAMMABLE READ ONLY MEMORY DEVICES HAVING UNIFORM PROGRAM CHARACTERISTIC AND METHODS OF PROGRAMMING THE SAME

CROSS-REFERENCE TO RELATED APPLICATIONS

The present application claims priority under 35 U.S.C 119(a) to Korean Patent Application No. 10-2016-0060450, filed on May 17, 2016, which is incorporated herein by reference in its entirety as though fully set forth herein.

BACKGROUND

The present invention relates generally to nonvolatile memory devices and, more particularly, to electrically programmable read only memory (EPROM) devices having a uniform program characteristic and methods of programming the same.

Semiconductor memory devices are typically categorized as either random access memory (RAM) devices or read only memory (ROM) devices according to data volatility. The RAM devices lose their stored data when their power supplies are interrupted. In contrast, the ROM devices retain their stored data even when their power supplies are interrupted. The ROM devices may also be classified as programmable ROM (PROM) devices or mask ROM devices according to data input methods, that is, data program methods. The PROM devices may be fabricated and sold out without program and may be directly programmed by customers (i.e., users) after fabrication. The mask ROM devices may be programmed during fabrication using implantation masks manufactured based on data requested by users. The PROM devices may include one-time PROM (OTPROM) devices, erasable PROM (EPROM) devices and electrically erasable PROM (EEPROM) devices. Once the EPROM devices are programmed, the programmed data of the EPROM devices cannot be electrically changed but can be physically erased using, for example, ultraviolet (UV) rays.

N-channel transistors or P-channel transistors may be used as cell transistors of the EPROM devices. If P-channel transistors are used as the cell transistors of the EPROM devices, the P-channel cell transistors may have a turn-off status as their initial status and may have a turn-on status as a programmed status. Thus, a read operation of the EPROM devices may be performed by sensing cell currents that flow through the P-channel cell transistors.

SUMMARY

In an embodiment in accordance with the present invention, an EPROM device includes a plurality of bit lines branching from a supply voltage line, a first group of enablement signal lines intersecting the plurality of bit lines, a plurality of unit cells respectively located at cross points of the plurality of bit lines and the first group of enablement signal lines, and a plurality of pass transistors and a plurality of load transistors. One of the pass transistors and one of the load transistors are coupled in series between the supply voltage line and each of the plurality of bit lines. The EPROM device further includes a plurality of comparators. Each of the plurality of comparators is configured to receive voltages of both ends of any one of the load transistors to generate an output signal. In addition, the EPROM device further includes a plurality of enablement signal generators. Each of the plurality of enablement signal generators is configured to receive one of the output signals of the comparators and one of a second group of enablement signals, and configured to output one of a third group of enablement signals to turn off one of the pass transistors if a program current of any one of the unit cells selected from the plurality of unit cells reaches a reference program current.

In accordance with another embodiment, a method of programming an EPROM device that includes a plurality of bit lines branching from a supply voltage line, a first group of enablement signal lines intersecting the plurality of bit lines, a plurality of unit cells respectively located at cross points of the plurality of bit lines and the first group of enablement signal lines, and a plurality of pass transistors and a plurality of load transistors, wherein one of the pass transistors and one of the load transistors are coupled in series between the supply voltage line and each of the plurality of bit lines includes detecting voltages of both ends of one of the load transistors, which is connected to any one of the unit cells selected from the plurality of unit cells during a program operation of the selected unit cell. The detected voltages are compared with each other to evaluate a program current flowing through the selected unit cell. The pass transistor connected to the selected unit cell is turned off to terminate the program operation, if the program current reaches a reference program current.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments in accordance with the present invention will be explained in more detail with reference to the accompanying drawings. Although the present invention is described with reference to a number of example embodiments thereof, it should be understood that numerous other modifications and variations may be devised by one skilled in the art that will fall within the spirit and scope of the invention. In the following description, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
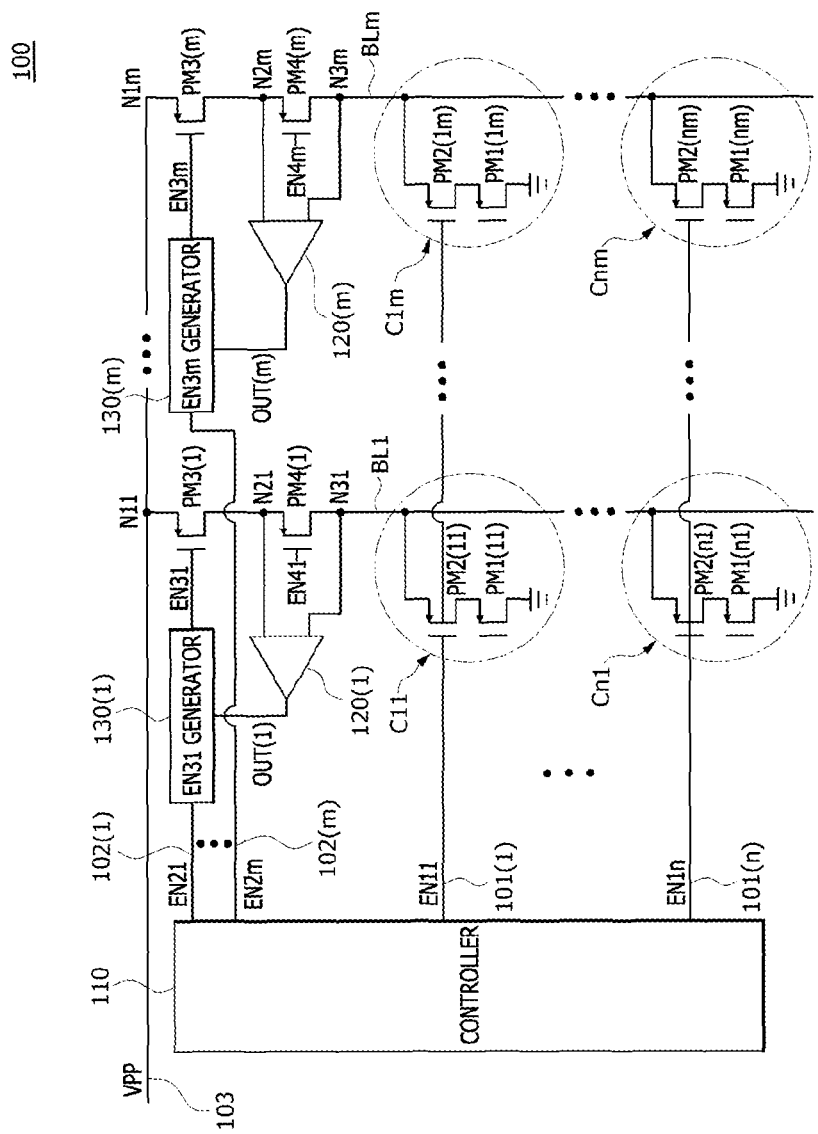
FIG. 1 is a schematic diagram illustrating an EPROM device in an embodiment in accordance with the present invention.

In FIG. 1, the EPROM device 100 may include a cell array comprised of a plurality of unit cells, for example, "n×m"-number of unit cells C11~C1m, . . . , and Cn1~Cnm. The unit cells C11~C1m, . . . , and Cn1~Cnm may be disposed at cross points of "n"-number of a first group of enablement signal lines 101(1)~101(n) and "m"-number of bit lines BL1~BLm, respectively. In some embodiments, the first group of enablement signal lines 101(1)~101(n) may be respectively disposed in rows of the cell array, and the bit lines BL1~BLm may be respectively disposed in columns of the cell array. The first group of enablement signal lines 101(1)~101(n) may also correspond to output lines of a controller 110. The controller 110 may output a first enablement signal EN11 of a first group of enablement signals EN11~EN1n through a first enablement signal line 101(1) of the first group of enablement signal lines 101(1)~101(n). Similarly, the controller 110 may output an $n^{th}$ enablement signal EN1n of the first group of enablement signals EN11~EN1n through an $n^{th}$ enablement signal line 101(n) of the first group of enablement signal lines 101(1)~101(n).

A unit cell C11 located at a cross point of the first row and the first column may be configured to include a first P-channel transistor PM1(11) and a second P-channel transistor PM2(11), which are coupled in series between the first bit line BL1 and a ground voltage terminal. The first P-channel transistor PM1(11) may act as a cell transistor, and the second P-channel transistor PM2(11) may act as a selection transistor. The first P-channel transistor PM1(11) may have a gate corresponding to a floating gate, a drain coupled to the ground voltage terminal, and a source coupled to a drain of the second P-channel transistor PM2(11). The second P-channel transistor PM2(11) may have a gate to which the first enablement signal EN11 is applied, a drain coupled to the source of the first P-channel transistor PM1(11), and a source coupled to the first bit line BL1.

A unit cell C1m located at a cross point of the first row and the $m^{th}$ column may be configured to include a first P-channel transistor PM1(1m) and a second P-channel transistor PM2(1m) which are coupled in series between the $m^{th}$ bit line BLm and the ground voltage terminal. The first P-channel transistor PM1(1m) may act as a cell transistor, and the second P-channel transistor PM2(1m) may act as a selection transistor. The first P-channel transistor PM1(1m) may have a gate corresponding to a floating gate, a drain coupled to the ground voltage terminal, and a source coupled to a drain of the second P-channel transistor PM2(1m). The second P-channel transistor PM2(1m) may have a gate to which the first enablement signal EN11 is applied, a drain coupled to the source of the first P-channel transistor PM1(1m), and a source coupled to the $m^{th}$ bit line BLm.

A unit cell Cn1 located at a cross point of the $n^{th}$ row and the first column may be configured to include a first P-channel transistor PM1(n1) and a second P-channel transistor PM2(n1) which are coupled in series between the first bit line BL1 and the ground voltage terminal. The first P-channel transistor PM1(n1) may act as a cell transistor, and the second P-channel transistor PM2(n1) may act as a selection transistor. The first P-channel transistor PM1(n1) may have a gate corresponding to a floating gate, a drain coupled to the ground voltage terminal, and a source coupled to a drain of the second P-channel transistor PM2(n1). The second P-channel transistor PM2(n1) may have a gate to which the $n^{th}$ enablement signal EN1n is applied, a drain coupled to the source of the first P-channel transistor PM1(n1), and a source coupled to the first bit line BL1.

A unit cell Cnm located at a cross point of the $n^{th}$ row and the $m^{th}$ column may be configured to include a first P-channel transistor PM1(nm) and a second P-channel transistor PM2(nm) which are coupled in series between the $m^{th}$ bit line BLm and the ground voltage terminal. The first P-channel transistor PM1(nm) may act as a cell transistor, and the second P-channel transistor PM2(nm) may act as a selection transistor. The first P-channel transistor PM1(nm) may have a gate corresponding to a floating gate, a drain coupled to the ground voltage terminal, and a source coupled to a drain of the second P-channel transistor PM2(nm). The second P-channel transistor PM2(nm) may have a gate to which the $n^{th}$ enablement signal EN1n is applied, a drain coupled to the source of the first P-channel transistor PM1(nm), and a source coupled to the $m^{th}$ bit line BLm.

The sources of the second P-channel transistors PM2(11)~PM2(n1) of the unit cells C11~Cn1 arrayed in the first column may be coupled to the first bit line BL1. The sources of the second P-channel transistors PM2(1m)~PM2(nm) of the unit cells C1m~Cnm arrayed in the $m^{th}$ column may be coupled to the $m^{th}$ bit line BLm. The gates of the second P-channel transistors PM2(11)~PM2(1m) of the unit cells C11~C1m arrayed in the first row may be coupled to the first enablement signal line 101(1). Thus, the first enablement signal EN11 may be simultaneously applied to all of the gates of the second P-channel transistors PM2(11)~PM2(1m) of the unit cells C11~C1m through the first enablement signal line 101(1). Similarly, the gates of the second P-channel transistors PM2(n1)~PM2(nm) of the unit cells Cn1~Cnm arrayed in the $n^{th}$ row may be coupled to the $n^{th}$ enablement signal line 101(n). Thus, the $n^{th}$ enablement signal EN1n may be simultaneously applied to all of the gates of the second P-channel transistors PM2(n1)~PM2(nm) of the unit cells Cn1~Cnm through the $n^{th}$ enablement signal line 101(n).

The bit lines BL1~BLm may be coupled to a supply voltage line 103 that transmits a supply voltage VPP. The first bit line BL1 may be coupled to a first node N11 of the supply voltage line 103, and the $m^{th}$ bit line BLm may be coupled to an $m^{th}$ node N1m of the supply voltage line 103. A third P-channel transistor PM3(1) and a fourth P-channel transistor PM4(1) may be coupled in series between the first node N11 and the first bit line BL1. The third P-channel transistor PM3(1) may have a source coupled to the supply voltage line 103, a gate to which a first enablement signal EN31 of a third group of enablement signals EN31~EN3$m$ is applied, and a drain coupled to a source of the fourth P-channel transistor PM4(1). The fourth P-channel transistor PM4(1) may have a source coupled to the drain of the third P-channel transistor PM3(1), a gate to which a first enablement signal EN41 of a fourth group of enablement signals EN41~EN4$m$ is applied, and a drain coupled to the first bit line BL1.

In some embodiments, the gate of the fourth P-channel transistor PM4(1) may be coupled to the ground voltage terminal. A third P-channel transistor PM3($m$) and a fourth P-channel transistor PM4($m$) may be coupled in series between the m$^{th}$ node N1$m$ and the m$^{th}$ bit line BL$m$. The third P-channel transistor PM3($m$) may have a source coupled to the supply voltage line 103, a gate to which an m$^{th}$ enablement signal EN3$m$ of the third group of enablement signals EN31~EN3$m$ is applied, and a drain coupled to a source of the fourth P-channel transistor PM4($m$). The fourth P-channel transistor PM4($m$) may have a source coupled to the drain of the third P-channel transistor PM3($m$), a gate to which an m$^{th}$ enablement signal EN4$m$ of the fourth group of enablement signals EN41~EN4$m$ is applied, and a drain coupled to the m$^{th}$ bit line BL$m$. In some embodiments, the gate of the fourth P-channel transistor PM4($m$) may be coupled to the ground voltage terminal.

A voltage of a second node N21 electrically connecting the drain of the third P-channel transistor PM3(1) to the source of the fourth P-channel transistor PM4(1), and a voltage of a third node N31 electrically connecting the drain of the fourth P-channel transistor PM4(1) to the first bit line BL1, may be inputted to two input terminals of a first comparator 120(1), respectively. An output signal of the first comparator 120(1) may be inputted to a first enablement signal generator 130(1) generating the first enablement signal EN31. The first enablement signal generator 130(1) may also receive a first enablement signal EN21 of a second group of enablement signals EN21~EN2$m$ outputted from the controller 110 through a second group of enablement signal lines 102(1)~102($m$). The first enablement signal generator 130(1) may output the first enablement signal EN31 in response to the first enablement signal EN21 and the output signal of the first comparator 120(1). The first comparator 120(1) may generate an output signal OUT(1) having a logic "low" level or a logic "high" level. The first comparator 120(1) may generate the output signal OUT(1) having a logic "low" level if a difference between the voltages of the second and third nodes N21 and N31 is less than a predetermined voltage. The first comparator 120(1) may generate the output signal OUT(1) having a logic "high" level if a difference between the voltages of the second and third nodes N21 and N31 is equal to or greater than the predetermined voltage.

In some embodiments, if both of the first enablement signal EN21 and the output signal OUT(1) have a logic "low" level, the first enablement signal generator 130(1) may generate the first enablement signal EN31 having a logic "low" level. In contrast, if at least one of the first enablement signal EN21 and the output signal OUT(1) has a logic "high" level, the first enablement signal generator 130(1) may generate the first enablement signal EN31 having a logic "high" level. The first enablement signal EN31 may be applied to the gate of the third P-channel transistor PM3(1) to control a switching operation of the third P-channel transistor PM3(1).

Similarly, a voltage of a second node N2$m$ electrically connecting the drain of the third P-channel transistor PM3($m$) to the source of the fourth P-channel transistor PM4($m$) and a voltage of a third node N3$m$ electrically connecting the drain of the fourth P-channel transistor PM4($m$) to the m$^{th}$ bit line BL$m$ may be inputted to two input terminals of an m$^{th}$ comparator 120($m$), respectively. An output signal of the m$^{th}$ comparator 120($m$) may be inputted to an m$^{th}$ enablement signal generator 130($m$) generating the m$^{th}$ enablement signal EN3$m$. The m$^{th}$ enablement signal generator 130($m$) may also receive an m$^{th}$ enablement signal EN2$m$ of the second group of enablement signals EN21~EN2$m$ outputted from the controller 110 through the second group of enablement signal lines 102(1)~102($m$).

The m$^{th}$ enablement signal generator 130($m$) may output the m$^{th}$ enablement signal EN3$m$ in response to the m$^{th}$ enablement signal EN2$m$ and the output signal of the m$^{th}$ comparator 120($m$). The m$^{th}$ comparator 120($m$) may generate an output signal OUT(m) having a logic "low" level or a logic "high" level. The m$^{th}$ comparator 120($m$) may generate the output signal OUT(m) having a logic "low" level if a difference between the voltages of the second and third nodes N2$m$ and N3$m$ is less than the predetermined voltage. The m$^{th}$ comparator 120($m$) may generate the output signal OUT(m) having a logic "high" level if a difference between the voltages of the second and third nodes N2$m$ and N3$m$ is equal to or greater than the predetermined voltage.

In some embodiments, if both of the m$^{th}$ enablement signal EN2$m$ and the output signal OUT(m) have a logic "low" level, the m$^{th}$ enablement signal generator 130($m$) may generate the m$^{th}$ enablement signal EN3$m$ having a logic "low" level. In contrast, if at least one of the m$^{th}$ enablement signal EN2$m$ and the output signal OUT(m) has a logic "high" level, the m$^{th}$ enablement signal generator 130($m$) may generate the m$^{th}$ enablement signal EN3$m$ having a logic "high" level. The m$^{th}$ enablement signal EN3$m$ may be applied to the gate of the third P-channel transistor PM3($m$) to control a switching operation of the third P-channel transistor PM3($m$).

Figure 2:
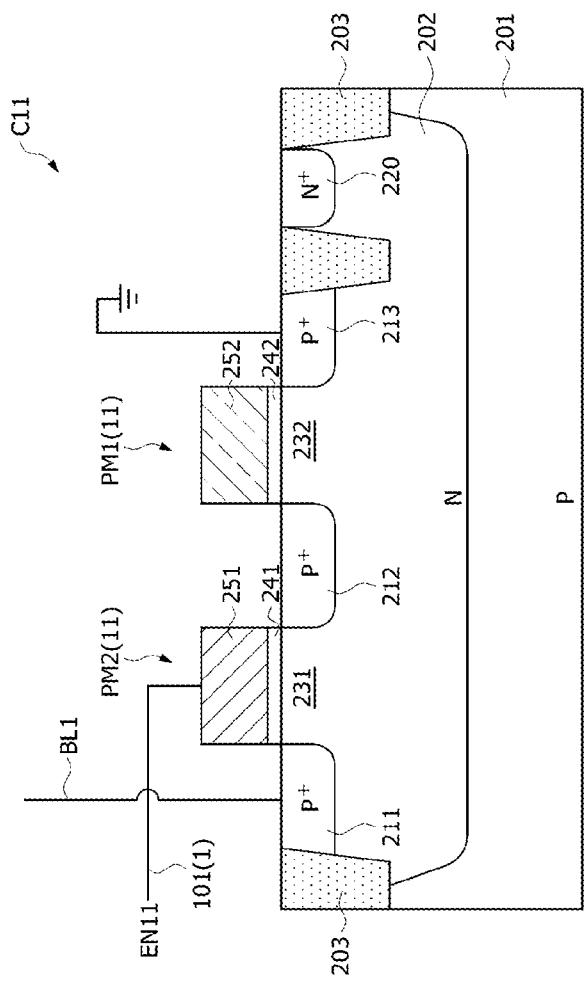
FIG. 2 is a cross-sectional view illustrating a unit cell of the EPROM device shown in FIG. 1 when a first P-channel transistor corresponding to a cell transistor of the unit cell has an initial status.

The unit cell shown in FIG. 2 may correspond to the unit cell C11 located at a cross point of the first row and the first column shown in FIG. 1, and each of the remaining unit cells may have the same configuration as the unit cell C11. Referring to FIG. 2, the unit cell C11 may include an N-type well region 202 disposed in a P-type substrate 201. A trench isolation layer 203 may be disposed in an upper portion of the P-type substrate 201 to define active regions. A first P-type junction region 211, a second P-type junction region 212 and a third P-type junction region 213 may be disposed in a first region of an upper portion of the N-type well region 202 to be spaced apart from each other. An N-type contact region 220 may be disposed in a second region of the upper portion of the N-type well region 202. The first region and the second region of the upper portion of the N-type well region 202 may be separated from each other by the trench isolation layer 203. The second P-type junction region 212 and the third P-type junction region 213 may be separated from each other by a second channel region 232.

A first gate insulation layer 241 and a first gate electrode 251 may be sequentially stacked on the first channel region 231. A second gate insulation layer 242 and a second gate electrode 252 may be sequentially stacked on the second channel region 232. The first P-type junction region 211, the first channel region 231, the second P-type junction region 212, the first gate insulation layer 241 and the first gate electrode 251 may constitute the second P-channel transistor PM2(11) (acting as a selection transistor) illustrated in FIG. 1. The second P-type junction region 212, the second channel region 232, the third P-type junction region 213, the second gate insulation layer 242, and the second gate electrode 252 may constitute the first P-channel transistor PM1(11) (acting as a cell transistor) illustrated in FIG. 1.

The second gate electrode 252 of the first P-channel transistor PM1(11) may be electrically floated to correspond to a floating gate. The second P-type junction region 212 and the third P-type junction region 213 may act as the source and the drain of the first P-channel transistor PM1(11), respectively. The second P-type junction region 212 may be electrically floated, and the third P-type junction region 213 may be grounded. The first gate electrode 251 of the second P-channel transistor PM2(11) may be coupled to the first enablement signal line 101(1), and the first enablement signal EN11 may be applied to the first gate electrode 251 of the second P-channel transistor PM2(11) through the first enablement signal line 101(1). The first P-type junction region 211 and the second P-type junction region 212 may act as the source and the drain of the second P-channel transistor PM2(11), respectively. The first P-type junction region 211 may be coupled to the first bit line BL1.

If the first P-channel transistor PM1(11) acting as a cell transistor has an initial status, no inversion layer may be formed in the second channel region 232. Thus, the first P-channel transistor PM1(11) may have an off-status. In such a case, although the second P-channel transistor PM2(11) acting as a selection transistor is turned on due to an inversion layer formed in the first channel region 231, no current may flow through the first bit line BL1 because the first P-channel transistor PM1(11) has a turn-off status.

Figure 3:
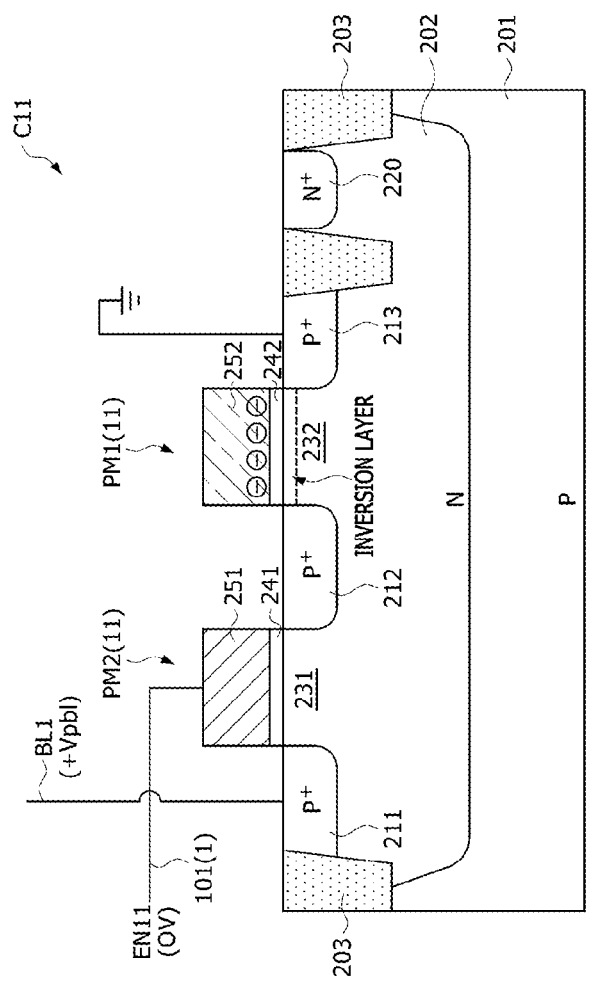
FIG. 3 is a cross-sectional view illustrating a unit cell of the EPROM device shown in FIG. 1 when a first P-channel transistor corresponding to a cell transistor of the unit cell has a programmed status.

FIG. 3 is a cross-sectional view illustrating the unit cell C11 of the EPROM device 100 shown in FIG. 1 when the first P-channel transistor PM1(11) corresponding to a cell transistor of the unit cell C11 has a programmed status. In FIG. 3, the same reference numerals or designators as used in FIG. 2 denote the same elements. Thus, the same explanation as provided with reference to FIG. 2 will be omitted to avoid duplicate explanations. Referring to FIG. 3, if the gate electrode (i.e., the first gate electrode 251) of the second P-channel transistor PM2(11) is grounded and a positive program bit line voltage +Vpbl is applied to the source (i.e., the first P-type junction region 211) of the second P-channel transistor PM2(11), the second P-channel transistor PM2(11) may be turned on. The positive program bit line voltage +Vpbl applied to the first P-type junction region 211 may be transmitted to the second P-type junction region 212 electrically floated. Since the third P-type junction region 213 is grounded, hot electrons may be generated in the vicinity of the second P-type junction region 212 due to an electric field between the second and third P-type junction regions 212 and 213 and the hot electrons may be injected into the gate electrode (i.e., the second gate electrode 252) of the first P-channel transistor PM1(11). As the hot electrons are injected into the second gate electrode 252 of the first P-channel transistor PM1(11), a P-type inversion layer may be formed in the second channel region 232 to turn on the first P-channel transistor PM1(11). Although not shown in FIG. 3, the positive program bit line voltage +Vpbl may be applied to the N-type contact region 220 during the above program operation of the first P-channel transistor PM1(11).

If the first P-channel transistor PM1(11) acting as a cell transistor has a programmed status, the first P-channel transistor PM1(11) may have an on-status because of the presence of the P-type inversion layer formed in the second channel region 232. In such a case, if the second P-channel transistor PM2(11) acting as a selection transistor is turned on, a current may flow through the first bit line BL1 because the first P-channel transistor PM1(11) has a turn-on status.

Figure 4:
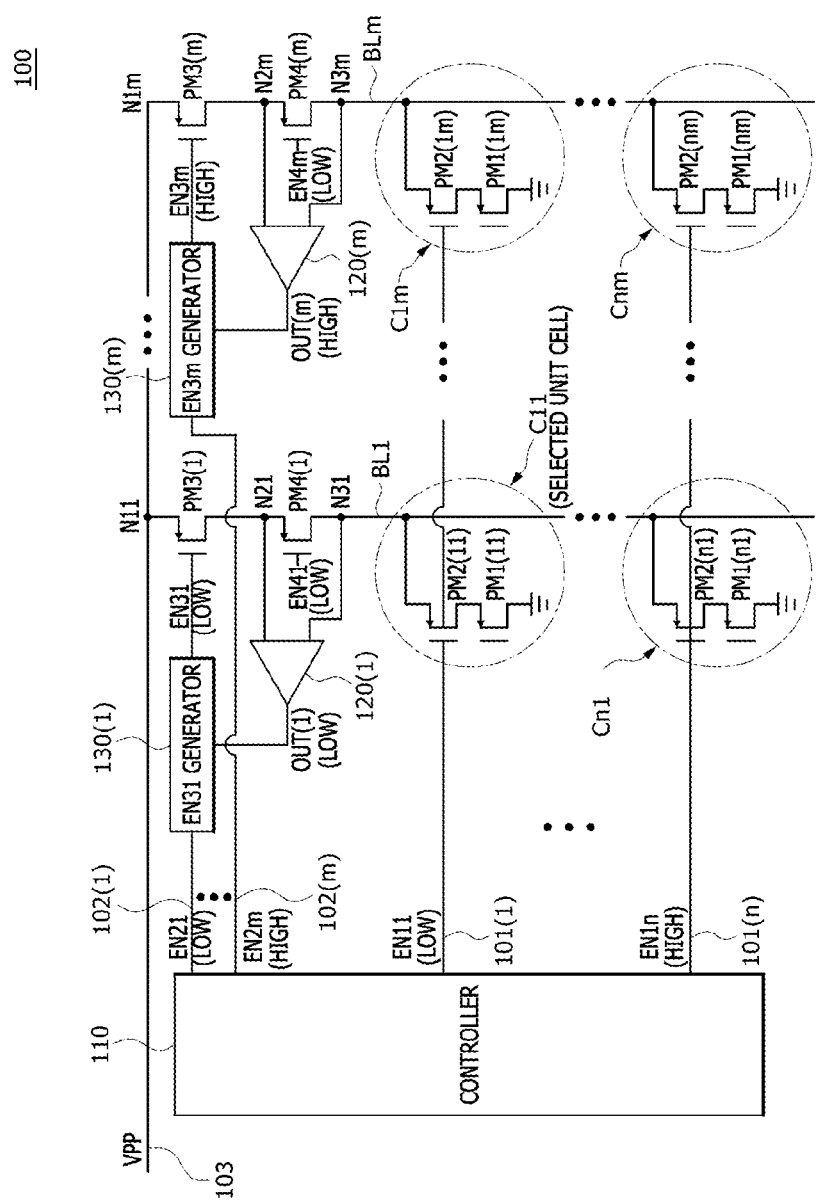
FIG. 4 is a schematic diagram illustrating a program operation of the EPROM device shown in FIG. 1.

In FIG. 4, the same reference numerals or designators as used in FIG. 1 denote the same elements. Referring to FIG. 4, a unit cell to be programmed may be selected by the first group of enablement signals EN11~EN1n and the second group of enablement signals EN21~EN2m. The unit cells arrayed in any one of the rows may be selected by the first group of enablement signals EN11~EN1n, and the unit cells arrayed in any one of the columns may be selected by the second group of enablement signals EN21~EN2m. One of the first group of enablement signals EN11~EN1n, which is applied to the selected unit cell, may have a logic "low" level, and the remaining signals of the first group of enablement signals EN11~EN1n may have a logic "high" level. One of the second group of enablement signals EN21~EN2m, which is applied to the selected unit cell, may have a logic "low" level, and the remaining signals of the second group of enablement signals EN21~EN2m may have a logic "high" level. While the second P-channel transistors arrayed in the row selected by any one (having a logic "low" level) of the first group of enablement signals EN11~EN1n may be turned on, the remaining second P-channel transistors arrayed in non-selected rows may be turned off. One of the enablement signal generators 130(1)~130(m) generating the third group of enablement signals EN31~EN3m may receive one (having a logic "low" level) of the second group of enablement signals EN21~EN2m to generate one (having a logic "low" level) of the third group of enablement signals EN31~EN3m that turns on one of the third P-channel transistors PM3(1)~PM3(m). In contrast, the remaining enablement signal generators may generate the remaining third group of enablement signals having a logic "high" level to turn off the remaining third P-channel transistors.

Hereinafter, the program operation of the EPROM device 100 will be described in conjunction with an example in which the selected unit cell to be programmed is the unit cell C11 located at a cross point of the first row and the first column. In order to program the selected unit cell C11, the controller 110 may output the first enablement signal EN11, having a logic "low" level, through the first enablement signal line 101(1) coupled to the selected unit cell C11, and may output the remaining second to $n^{th}$ enablement signals EN12~EN1n having a logic "high" level through the remaining second to $n^{th}$ enablement signal lines 101(2)~101(n). All of the second P-channel transistors PM2(11)~PM2(1m) of the unit cells C11~C1m arrayed in the first row may be turned on in response to the first enablement signal EN11 having a logic "low" level. In contrast, all of the second P-channel transistors of the unit cells arrayed in the remaining second to $n^{th}$ rows may be turned off in response to the second to $n^{th}$ enablement signals EN12~EN1n having a logic "high" level.

In addition, the controller 110 may output the first enablement signal EN21, having a logic "low" level, through the first enablement signal line 102(1) coupled to the first column in which the selected unit cell C11 is arrayed, and may output the remaining second to $m^{th}$ enablement signals EN22~EN2m, having a logic "high" level, through the remaining second to $m^{th}$ enablement signal lines 102(2)~102(m). The first enablement signal generator 130(1) of the enablement signal generators 130(1)~130(m) may receive the first enablement signal EN21 (having a logic "low" level) of the second group of enablement signals EN21~EN2m and the output signal OUT(1) of the first comparator 120(1). The first comparator 120(1) may generate the output signal OUT(1) having a logic "low" level until a difference between the voltages of the second node N21 and the third node N31 is equal to a predetermined voltage, and the output signal OUT(1) having a logic "low" level may be applied to the first enablement signal generator 130(1). Accordingly, the first enablement signal generator 130(1) may output the first enablement signal EN31 of the third group of enablement signals EN31~EN3$m$, which has the same logic level as the first enablement signal EN21, having a logic "low" level. As a result, the third P-channel transistor PM3(1) arrayed in the first column may be turned on in response to the first enablement signal EN31 having a logic "low" level.

The $m^{th}$ enablement signal generator 130($m$) of the enablement signal generators 130(1)~130($m$) may receive the $m^{th}$ enablement signal EN2$m$ (having a logic "high" level) of the second group of enablement signals EN21~EN2$m$ and the output signal OUT(m) of the $m^{th}$ comparator 120($m$). If the $m^{th}$ enablement signal EN2$m$ having a logic "high" level is inputted to the $m^{th}$ enablement signal generator 130($m$), the $m^{th}$ enablement signal generator 130($m$) may output the $m^{th}$ enablement signal EN3$m$ having a logic "high" level, regardless of a logic level of the output signal OUT(m) of the $m^{th}$ comparator 120($m$). As a result, the third P-channel transistor PM3($m$) arrayed in the $m^{th}$ column may be turned off in response to the $m^{th}$ enablement signal EN3$m$ having a logic "high" level.

In the above-described program operation, all of the fourth group of enablement signals EN41~EN4$m$ may have a logic "low" level to turn on all of the fourth P-channel transistors PM4(1)~PM4($m$). In such a case, since the third P-channel transistor PM3(1) arrayed in the first column is turned on, the selected unit cell C11 may be programmed to allow a program current to flow through the first bit line BL1. In contrast, since the remaining third P-channel transistors PM3(2)~PM3($m$) arrayed in the remaining columns are turned off, no program current may flow through the second to $m^{th}$ bit lines BL2~BLm. As a result, since the second P-channel transistor PM2(11) of the selected unit cell C11 among the unit cells C11~Cn1 arrayed in the first column is turned on, the first P-channel transistor PM1(11) of the selected unit cell C11 may be selectively programmed. However, since all of the remaining second P-channel transistors PM2(21)~PM2($n$1) of the non-selected unit cells C21~Cn1 arrayed in the first column are turned off, the first P-channel transistors PM1(21)~PM1($n$1) of the non-selected unit cell C21~Cn1 may not be programmed.

Figure 5:
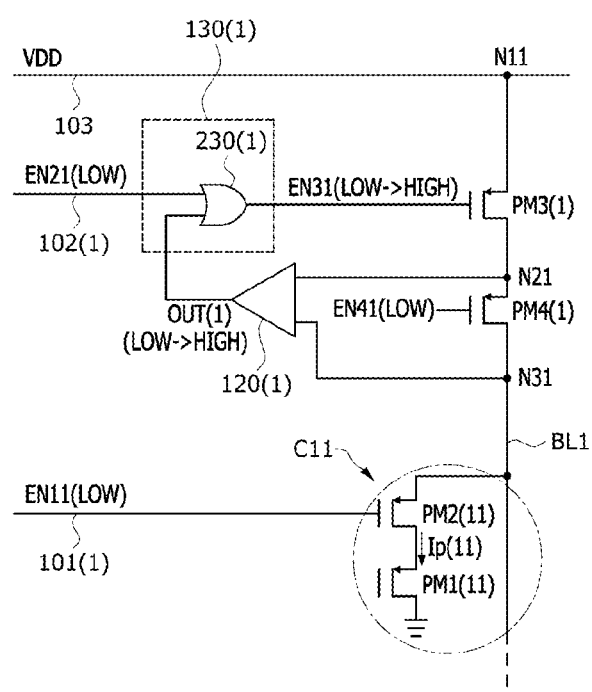
FIG. 5 is a circuit diagram illustrating a program operation of a first unit cell included in the EPROM device of FIG. 1 to obtain a uniform program characteristic.
Figure 6:
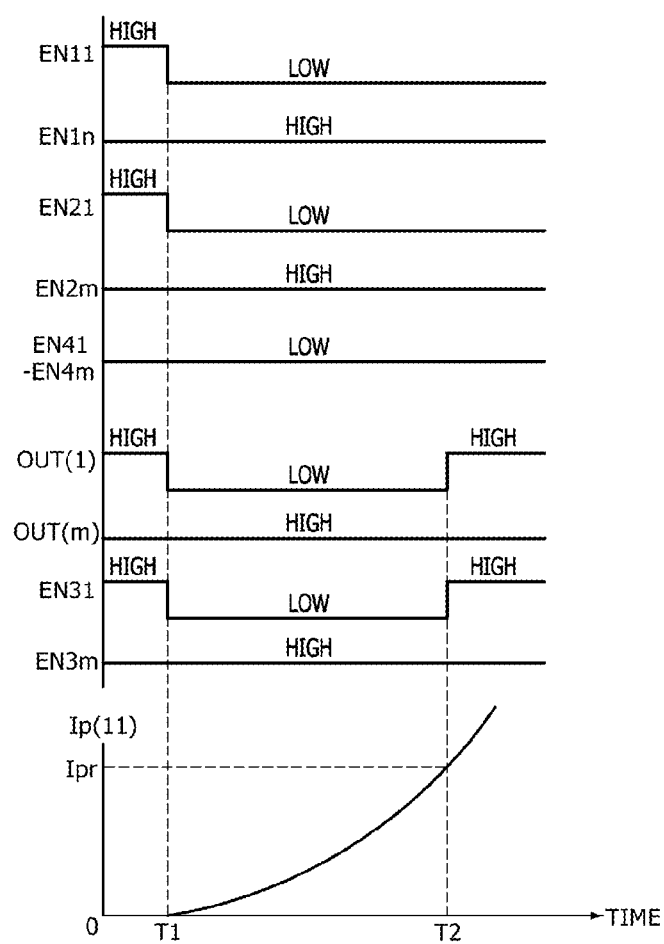
FIG. 6 is a timing diagram illustrating a program operation of a first unit cell included in the EPROM device of FIG. 1 to obtain a uniform program characteristic.

FIG. 5 is a circuit diagram illustrating a first program operation of a first unit cell C11 included in the EPROM device 100 of FIG. 1 to obtain a uniform program characteristic, and FIG. 6 is a timing diagram illustrating the first program operation of the first unit cell C11 included in the EPROM device 100 of FIG. 1 to obtain a uniform program characteristic. In FIG. 5, the same reference numerals or designators as used in FIG. 1 denote the same elements. Referring to FIGS. 5 and 6, at a first point of time "T1" that the first program operation of the first unit cell C11 located at a cross point of the first row and the first column starts, the controller (110 of FIG. 1) may generate the first enablement signal EN11 having a logic "low" level and the first enablement signal EN21 having a logic "low" level.

In addition, at the first point of time "T1", the controller 110 may generate the second to $n^{th}$ enablement signals EN12~EN1$n$ having a logic "high" level and the second to $m^{th}$ enablement signals EN22~EN2$m$ having a logic "high" level. In such a case, all of the fourth group of enablement signals EN41~EN4$m$ may be generated to have a logic "low" level. The second P-channel transistor PM2(11) acting as a selection transistor of the first unit cell C11 may be turned on in response to the first enablement signal EN11 having a logic "low" level, and the fourth P-channel transistor PM4(1) may be turned on in response to the first enablement signal EN41 having a logic "low" level.

The first enablement signal generator 130(1) may generate the first enablement signal EN31 (having a logic "low" level) of the third group of enablement signals EN31~EN3$m$ in response to the first enablement signal EN21 having a logic "low" level and the output signal OUT(1) (having a logic "low" level) of the first comparator 120(1). The third P-channel transistor PM3(1) may be turned on in response to the first enablement signal EN31 having a logic "low" level. As a result, since the second P-channel transistor PM2(11), the third P-channel transistor PM3(1) and the fourth P-channel transistor PM4(1) are all turned on, the first P-channel transistor PM1(11) acting as a cell transistor of the first unit cell C11 may be selectively programmed. The first P-channel transistor PM1(11) may be programmed by the same program mechanism as described with reference to FIG. 3.

In some embodiments, the first enablement signal generator 130(1) may be realized using an OR gate 230(1), as illustrated in FIG. 5. Although not shown in the drawings, each of the second to $m^{th}$ enablement signal generators 130(2)~130($m$) may also be realized using an OR gate. The first comparator 120(1) may receive the voltages of the drain and the source of the fourth P-channel transistor PM4(1) arrayed in the first column, that is, the voltages of the second and third nodes N21 and N31 in the first column. The voltage of the third node N31 may correspond to a voltage that remains after subtracting a voltage drop across the fourth P-channel transistor PM4(1) from a voltage of the second node N21. The voltage drop across the fourth P-channel transistor PM4(1) may increase to be proportional to a program current Ip(11) flowing through the fourth P-channel transistor PM4(1). Thus, the program current Ip(11) flowing from the first node N11 toward the ground voltage terminal coupled to the drain of the first P-channel transistor PM1(11), during the first program operation of the first P-channel transistor PM1(11), may be evaluated by comparing the voltage of the second node N21 with the voltage of the third node N31.

As described with reference to FIG. 3, during the first program operation of the first P-channel transistor PM1(11), hot electrons may be injected into the gate electrode of the first P-channel transistor PM1(11). As a result, an inversion layer may be formed in the channel region of the first P-channel transistor PM1(11) to generate the program current Ip(11) that flows between the source and the drain of the first P-channel transistor PM1(11). The program current Ip(11) may increase from the first point of time "T1" during the first program operation as the time elapses, as illustrated in FIG. 6. The first comparator 120(1) may compare the voltage of the second node N21 with the voltage of the third node N31 and may change a level of the output signal OUT(1) from a logic "low" level into a logic "high" level at a second point of time "T2" when the program current Ip(11) reaches a reference program current Ipr.

The remaining comparators 120(2)~120($m$) may still output their output signals having a logic "high" level. Since a level of the output signal OUT(1) of the first comparator 120(1) is changed from a logic "low" level into a logic "high" level at the second point of time "T2", a level of an output signal (i.e., the first enablement signal EN31) of the first enablement signal generator 130(1) may also be changed from a logic "low" level into a logic "high" level by a logical operation of the OR gate 230(1) at the second point of time "T2". As a result, the third P-channel transistor PM3(1) may be turned off to terminate the first program operation of the first P-channel transistor PM1(11) acting as a cell transistor of the first unit cell C11. During the first program operation, the first P-channel transistor PM1(11) acting as a cell transistor of the first unit cell C11 may have a program characteristic which is capable of allowing the program current Ip(11), being substantially equal to the reference program current Ipr, to flow through the channel region thereof.

Figure 7:
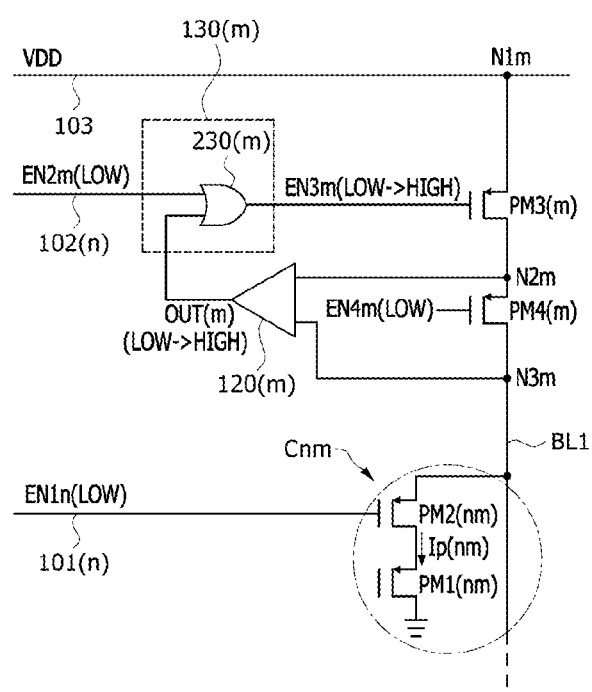
FIG. 7 is a circuit diagram illustrating a program operation of a second unit cell included in the EPROM device of FIG. 1 to obtain a uniform program characteristic.
Figure 8:
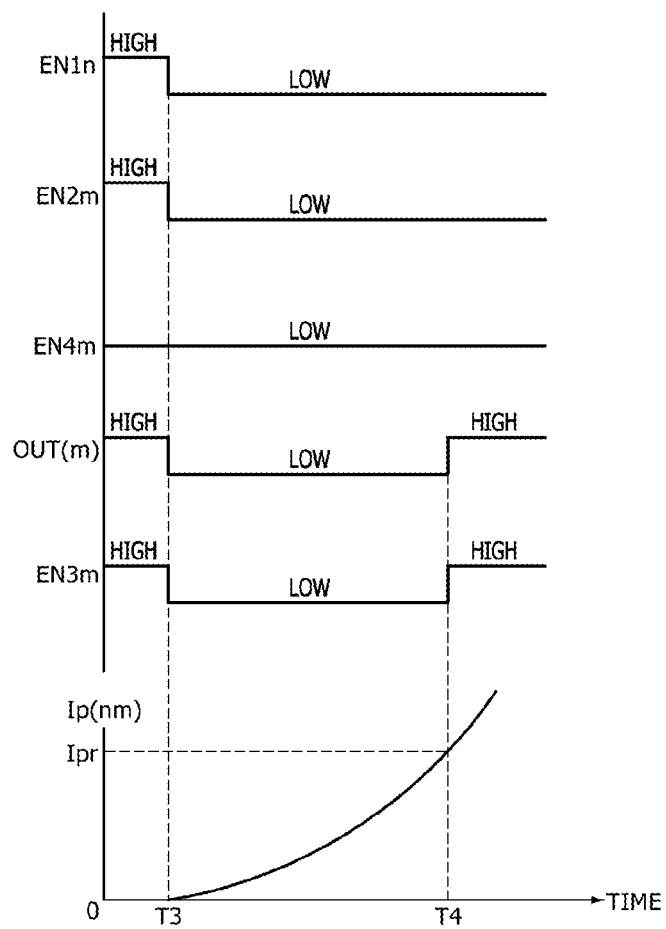
FIG. 8 is a timing diagram illustrating a program operation of a second unit cell included in the EPROM device of FIG. 1 to obtain a uniform program characteristic.

FIG. 7 is a circuit diagram illustrating a second program operation of a second unit cell Cnm included in the EPROM device 100 of FIG. 1 to obtain a uniform program characteristic, and FIG. 8 is a timing diagram illustrating the second program operation of the second unit cell Cnm included in the EPROM device 100 of FIG. 1 to obtain a uniform program characteristic. In FIG. 7, the same reference numerals or designators as used in FIG. 1 denote the same elements. Referring to FIGS. 7 and 8, at a third point of time "T3" that the second program operation of the second unit cell Cnm located at a cross point of the $n^{th}$ row and the $m^{th}$ column starts, the controller (110 of FIG. 1) may generate the $n^{th}$ enablement signal EN1$n$ having a logic "low" level and the $m^{th}$ enablement signal EN2$m$ having a logic "low" level. In addition, at the third point of time "T3", the controller 110 may generate the first to $(n-1)^{th}$ enablement signals EN11~EN1($n-1$) having a logic "high" level and the first to $(m-1)^{th}$ enablement signals EN21~EN2($m-1$) having a logic "high" level.

In such a case, all of the fourth group of enablement signals EN41~EN4$m$ may be generated to have a logic "low" level. The second P-channel transistor PM2($nm$), acting as a selection transistor of the second unit cell Cnm, may be turned on in response to the $n^{th}$ enablement signal EN1$n$ having a logic "low" level, and the fourth P-channel transistor PM4($m$) may be turned on in response to the $m^{th}$ enablement signal EN4$m$ having a logic "low" level. The $m^{th}$ enablement signal generator 130($m$) may generate the $m^{th}$ enablement signal EN3$m$ (having a logic "low" level) of the third group of enablement signals EN31~EN3$m$ in response to the $m^{th}$ enablement signal EN2$m$ having a logic "low" level and the output signal OUT(m) (having a logic "low" level) of the $m^{th}$ comparator 120($m$). The third P-channel transistor PM3($m$) may be turned on in response to the $m^{th}$ enablement signal EN3$m$ having a logic "low" level. As a result, since the second P-channel transistor PM2($nm$), the third P-channel transistor PM3($m$), and the fourth P-channel transistor PM4($m$) are all turned on, the first P-channel transistor PM1($nm$) acting as a cell transistor of the second unit cell Cnm may be selectively programmed. The first P-channel transistor PM1($nm$) may be programmed by the same program mechanism as described with reference to FIG. 3.

In some embodiments, the $m^{th}$ enablement signal generator 130($m$) may be realized using an OR gate 230($m$), as illustrated in FIG. 7. The $m^{th}$ comparator 120($m$) may receive the voltages of the drain and the source of the fourth P-channel transistor PM4($m$) arrayed in the $m^{th}$ column, that is, the voltages of the second and third nodes N2$m$ and N3$m$ in the $m^{th}$ column. The voltage of the third node N3$m$ may correspond to a voltage that remains after subtracting a voltage drop across the fourth P-channel transistor PM4($m$) from a voltage of the second node N2$m$. The voltage drop across the fourth P-channel transistor PM4($m$) may increase to be proportional to a program current Ip(nm) flowing through the fourth P-channel transistor PM4($m$). Thus, the program current Ip(nm), flowing from the first node N1$m$ toward the ground voltage terminal, coupled to the drain of the first P-channel transistor PM1($nm$) during the second program operation of the first P-channel transistor PM1($nm$), may be evaluated by comparing the voltage of the second node N2$m$ with the voltage of the third node N3$m$.

As described with reference to FIG. 3, during the second program operation of the first P-channel transistor PM1($nm$), hot electrons may be injected into the gate electrode of the first P-channel transistor PM1($nm$). As a result, an inversion layer may be formed in the channel region of the first P-channel transistor PM1($nm$) to generate the program current Ip(nm) that flows between the source and the drain of the first P-channel transistor PM1($nm$). The program current Ip(nm) may increase from the third point of time "T1" during the second program operation as the time elapses, as illustrated in FIG. 8.

The $m^{th}$ comparator 120($m$) may compare the voltage of the second node N2$m$ with the voltage of the third node N3$m$ and may change a level of the out signal OUT(m) from a logic "low" level into a logic "high" level at a fourth point of time "T4" that the program current Ip(nm) reaches a reference program current Ipr. The remaining comparators 120(1)~120($m-1$) may still output their output signals having a logic "high" level. Since a level of the output signal OUT(m) of the $m^{th}$ comparator 120($m$) is changed from a logic "low" level into a logic "high" level at the fourth point of time "T4", a level of an output signal (i.e., the $m^{th}$ enablement signal EN3$m$) of the $m^{th}$ enablement signal generator 130($m$) may also be changed from a logic "low" level into a logic "high" level by a logical operation of the OR gate 230($m$) at the fourth point of time "T4". As a result, the third P-channel transistor PM3($m$) may be turned off to terminate the second program operation of the first P-channel transistor PM1($nm$), acting as a cell transistor of the second unit cell Cnm. During the second program operation, the first P-channel transistor PM1($nm$) acting as a cell transistor of the second unit cell Cnm may have a program characteristic which is capable of allowing the program current Ip(nm), being substantially equal to the reference program current Ipr, to flow through the channel region thereof.

Figure 9:
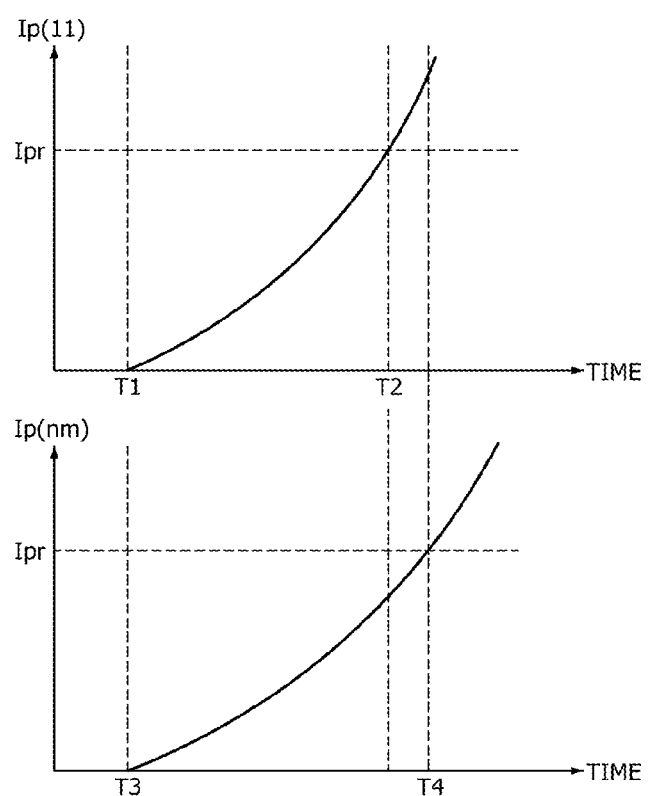
FIG. 9 illustrates two graphs for comparing a program characteristic of the first unit cell programmed by a first program operation shown in FIGS. 5 and 6 with a program characteristic of the second unit cell programmed by a second program operation shown in FIGS. 7 and 8.

FIG. 9 illustrates two graphs for comparing a program characteristic of the first unit cell C11 programmed by the first program operation shown in FIGS. 5 and 6 with a program characteristic of the second unit cell Cnm programmed by the second program operation shown in FIGS. 7 and 8. Referring to FIGS. 5, 7 and 9, the program current Ip(11) flowing through the first P-channel transistor PM1 (11), acting as a cell transistor of the first unit cell C11, may commence to increase at the first point of time "T1" that the first program operation starts. The program current Ip(11) may reach the reference program current Ipr at the second point of time "T2". Thus, the first program operation may terminate at the second point of time "T2". The first unit cell C11 may have a program characteristic which is capable of allowing the program current Ip(11), being substantially equal to the reference program current Ipr, to flow therethrough.

For the second unit cell Cnm, the program current Ip(nm) flowing through the first P-channel transistor PM1($nm$), acting as a cell transistor of the second unit cell Cnm, may commence to increase at the third point of time "T3" when the second program operation starts. The program current Ip(nm) may reach the reference program current Ipr at the fourth point of time "T4". Thus, the second program operation may terminate at the fourth point of time "T4". The second unit cell Cnm may have a program characteristic which is capable of allowing the program current Ip(nm), being substantially equal to the reference program current Ipr, to flow therethrough. As illustrated in FIG. 9, a first time period (from the first point of time "T1" until the second point of time "T2") in which the first program operation of the first unit cell C11 is performed may be relatively shorter than a second time period (from the third point of time "T3" until the fourth point of time "T4") in which the second program operation of the second unit cell Cnm is performed. This difference between the first and second time periods may occur because a voltage of the first node (N11 of FIG. 1), coupled to the first unit cell C11, is different from a voltage of the $m^{th}$ node (N1m of FIG. 1), coupled to the second unit cell Cnm, due to a voltage drop across a portion of the supply voltage line 103. Nevertheless, according to the EPROM device 100 described with reference to FIGS. 1 to 8, the program current Ip(11) of the first unit cell C11 selectively programmed during the first program operation, and the program current Ip(nm) of the second unit cell Cnm, selectively programmed during the second program operation, may be substantially equal to the reference program current Ipr at the points of time that the first and second program operations terminate. This may mean that the first and second unit cells C11 and Cnm have a uniform program characteristic. Moreover, the on/off control of the third P-channel transistors PM3(1) and PM3(m) for obtaining the uniform program characteristic may be achieved by comparing voltages of two different nodes without use of a method of sensing bit line currents. Thus, power consumption of the EPROM device 100 may be reduced.

While certain embodiments have been described above, it will be understood by those skilled in the art that the embodiments described are by way of example only. Accordingly, the memory devices and programming methods described herein should not be limited based on the described embodiments. Rather, the memory devices and programming methods described herein should only be limited in light of the claims that follow, when taken in conjunction with the above description and accompanying drawings.

What is claimed is:

1. An electrically programmable read only memory (EPROM) device comprising:
   a plurality of bit lines branching from a supply voltage line;
   a first group of enablement signal lines intersecting the plurality of bit lines;
   a plurality of unit cells respectively located at cross points of the plurality of bit lines and the first group of enablement signal lines;
   a plurality of pass transistors and a plurality of load transistors, wherein one of the pass transistors and one of the load transistors are coupled in series between the supply voltage line and each of the plurality of bit lines;
   a plurality of comparators, each of which is configured to receive voltages of both ends of any one of the load transistors to generate an output signal; and
   a plurality of enablement signal generators, each of which is configured to receive one of the output signals of the comparators and one of a second group of enablement signals and configured to output one of a third group of enablement signals to turn off one of the pass transistors if a program current of any one of the unit cells selected from the plurality of unit cells reaches a reference program current.

2. The EPROM device of claim 1, wherein each of the plurality of unit cells is configured to include a selection transistor and a cell transistor which are coupled in series between any one of the bit lines and a ground voltage terminal.

3. The EPROM device of claim 2, wherein the cell transistor is comprised of a first P-channel transistor and the selection transistor is comprised of a second P-channel transistor.

4. The EPROM device of claim 3,
   wherein the first P-channel transistor has a gate corresponding to a floating gate, a drain coupled to the ground voltage terminal, and a source coupled to a drain of the second P-channel transistor; and
   wherein the second P-channel transistor has a gate coupled to one of the first group of enablement signal lines, a source coupled to one of the plurality of bit lines, and a drain coupled to the source of the first P-channel transistor.

5. The EPROM device of claim 1, wherein each of the pass transistors and each of the load transistors are comprised of a third P-channel transistor and a fourth P-channel transistor, respectively.

6. The EPROM device of claim 5,
   wherein the third P-channel transistor has a gate to which one of the third group of enablement signals is applied, a source coupled to the supply voltage line through a first node, and a drain coupled to a second node; and
   wherein the fourth P-channel transistor has a gate to which one of a fourth group of enablement signals is applied, a source coupled to the second node, and a drain coupled to one of the plurality of bit lines through a third node.

7. The EPROM device of claim 6, wherein the fourth group of enablement signals have a logic "low" level while a program operation of the plurality of unit cells is performed.

8. The EPROM device of claim 7, wherein each of the comparators is configured to receive and compare voltages of the second and third nodes with each other to generate the output signal having a logic "low" level if the program current of the selected unit cell is less than the reference program current and to generate the output signal having a logic "high" level if the program current of the selected unit cell is equal to or greater than the reference program current, while the program operation of the plurality of unit cells is performed.

9. The EPROM device of claim 8, wherein each of the plurality of enablement signal generators is comprised of an OR gate that receives one of the second group of enablement signals and one of the output signals of the comparators to generate one of the third group of enablement signals.

10. A method of programming an electrically programmable read only memory (EPROM) device including a plurality of bit lines branching from a supply voltage line, a first group of enablement signal lines intersecting the plurality of bit lines, a plurality of unit cells respectively located at cross points of the plurality of bit lines and the first group of enablement signal lines, and a plurality of pass transistors and a plurality of load transistors, wherein one of the pass transistors and one of the load transistors are coupled in series between the supply voltage line and each of the plurality of bit lines, the method comprising:
   detecting voltages of both ends of one of the load transistors, which is connected to any one of the unit cells selected from the plurality of unit cells during a program operation of the selected unit cell;
   comparing the detected voltages to evaluate a program current flowing through the selected unit cell; and turning off the pass transistor connected to the selected unit cell to terminate the program operation, if the program current reaches a reference program current.

11. The method of claim 10, wherein each of the plurality of unit cells is configured to include a selection transistor and a cell transistor which are coupled in series between any one of the bit lines and a ground voltage terminal.

12. The method of claim 11, wherein the cell transistor is comprised of a first P-channel transistor and the selection transistor is comprised of a second P-channel transistor.

13. The method of claim 12,
wherein the first P-channel transistor has a gate corresponding to a floating gate, a drain coupled to the ground voltage terminal, and a source coupled to a drain of the second P-channel transistor; and
wherein the second P-channel transistor has a gate coupled to one of the first group of enablement signal lines, a source coupled to one of the plurality of bit lines, and a drain coupled to the source of the first P-channel transistor.

14. The method of claim 10, wherein each of the pass transistors and each of the load transistors are comprised of a third P-channel transistor and a fourth P-channel transistor, respectively.

15. The method of claim 14,
wherein the third P-channel transistor has a gate to which one of a third group of enablement signals is applied, a source coupled to the supply voltage line through a first node, and a drain coupled to a second node; and
wherein the fourth P-channel transistor has a gate to which one of a fourth group of enablement signals is applied, a source coupled to the second node, and a drain coupled to one of the plurality of bit lines through a third node.

16. The method of claim 10, wherein the load transistors are turned on while a program operation of the plurality of unit cells is performed.

17. The method of claim 10, wherein comparing the detected voltages to evaluate the program current includes extracting a voltage drop across the load transistor coupled to the selected unit cell and evaluating the program current using the extracted voltage drop.

* * * * *